United States Patent [19]

Kaya et al.

[11] Patent Number: 4,797,177

[45] Date of Patent: Jan. 10, 1989

[54] METHOD OF CUTTING AN ORGANIC MEMBRANE

[75] Inventors: Toshio Kaya, Iwakuni; Makoto Fujimoto, Waki, both of Japan

[73] Assignee: Mitsui Petrochemical Industries, Ltd., Tokyo, Japan

[21] Appl. No.: 151,204

[22] Filed: Feb. 1, 1988

[30] Foreign Application Priority Data

Feb. 3, 1987 [JP] Japan .................................. 62-23750

[51] Int. Cl.⁴ .......................... B44C 1/22; B29C 37/00
[52] U.S. Cl. ..................................... 156/630; 156/645; 156/655; 156/668; 156/267; 156/640
[58] Field of Search ............... 152/629, 630, 635, 654, 152/655, 645, 668, 267, 640

[56] References Cited

U.S. PATENT DOCUMENTS

| | | | |
|---|---|---|---|
| 3,447,985 | 6/1969 | Seitz | 156/640 |
| 4,523,974 | 6/1985 | Duly et al. | 156/630 |
| 4,608,334 | 5/1987 | Doornveld | 156/640 |

*Primary Examiner*—William A. Powell
*Attorney, Agent, or Firm*—Sherman and Shalloway

[57] ABSTRACT

An organic membrane is stretched over, or adhered to, a frame or a substrate, and that part of the membrane which extends out of the frame or substrate is cut by bringing an injection syringe-like needle into contact with, or approach to, the lateral end surface of the frame or substrate and while moving the needle along said lateral end surface, injecting an organic solvent from the needle and dissolving said membrane along the lateral end surface of the frame or substrate. By this method, the organic membrane can be cut without generating foreign matter such as cut dust.

3 Claims, 1 Drawing Sheet

METHOD OF CUTTING AN ORGANIC MEMBRANE

BACKGROUND OF THE INVENTION

1. Field of the Invention

This invention relates to a method of cutting an organic membrane, and more specifically, to a method of cutting an organic membrane which comprises adhering or intimately adhering (to be referred to simply "adhering") the organic membrane to a frame or substrate and then cutting that part of the organic membrane which extends out of the frame or substrate (to be sometimes referred to as the frame or the like) along the frame or the like without generating foreign matter such as cut dust.

2. Description of the Prior Art

One example of an organic membrane to be adhered to a frame or the like is a pellicle used as a dust-preventing cover for a photomask or a reticle. Generally, the pellicle is obtained by taking up on a provision frame a thin film of nitrocellulose or ethyl cellulose, for example, formed on a glass plate by a spinner method or a pull-up method (by pulling up from a solution), the stretching the thin film over a pellicle frame, and cutting that part of the film which extends out of the frame along the frame. Cutting is usually effected by a knife, but laser may sometimes be used. In any case, cut dust inevitably occurs in knife cutting, and occurrence of burnt dust is inevitable in laser cutting. Such dusts, even minute ones, can be a problem in the process of producing semiconductor devices, above all in fields requiring rigorous dust-preventing measures, for example in a step of exposing resists. If, for example, the cut dust adheres to the pellicle, it is likely to fall at the time of mounting the pellicle on the reticle and to adhere to the circuit pattern. This may lead to the production of devices having unacceptable quality.

SUMMARY OF THE INVENTION

It is an object of this invention to provide a method which is used in fields requiring rigorous dust-preventing measures, and by which in the process of producing devices provided with an organic membrane, the membrane is adhered to a frame or the like and that part of the membrane which extends out of the frame or the like can be cut along the frame or the like without generating foreign matter such as cut dust.

According to this invention, there is provided a method of cutting an organic membrane by means of an organic solvent capable of dissolving said organic membrane. The method of this invention comprises bringing an injection syringe-like needle into contact with, or approach to, the lateral end surface of a frame or substrate to which the organic membrane is adhered, and while moving the needle along the lateral end surface of the frame or substrate, injecting an organic solvent capable of dissolving the organic membrane from the needle thereby cutting the membrane along the frame or substrate by dissolving.

According to the method of this invention, that part of the organic membrane adhering to the frame or the like which extends out of the frame or the like is cut by the organic solvent injected from the needle moving along the lateral end surface of the frame or the like. Hence, foreign matter such as cut dust does not occur during cutting, and the method of the invention is suitable for use in fields requiring rigorous dust control, for example in the process of exposing resists in the production of semiconductor devices.

BRIEF DESCRIPTION OF THE ACCOMPANYING DRAWINGS

FIG. 1 shows a first embodiment of the method of this invention, in which a needle 1 is pierced through a pellicle 2 from above or put through it while perforating it with an organic solvent dropped from the tip of the needle and then kept along the lateral end surface of a pellicle frame 3 with a suitable clearance permitting occurrence of a capillary phenomenon, and by moving this needle, the pellicle 2 is cut along the frame by the effect of the organic solvent injected from the needle.

FIG. 2 shows a second embodiment, in which the needle 1 is put obliquely through the pellicle 2, and moved along the lateral end surface of the frame while its tip is in approach to the lateral end surface of the frame with a suitable clearance, or in contact with the lateral end surface of the frame, thereby cutting the pellicle 2 along the frame.

FIG. 3 shows a third embodiment, in which the needle 1 is put obliquely through the pellicle 2 from the site of contact between the pellicle frame 3 and the pellicle 2, and is moved inclinedly with the frame 3 used as a fulcrum thereby effecting cutting of the pellicle 2 along the frame.

FIG. 4 shows a fourth embodiment, in which the needle 1 is placed below the pellicle 2 and brought into contact with or approach to the lateral end surface of the pellicle frame 3, the tip of the needle 1 is caused to approach that site of the pellicle which is to be cut, and the organic solvent injected from the tip of the needle is directly contacted with the pellicle to thereby dissolve and thus cut the pellicle.

FIG. 5 shows a fifth embodiment, in which the needle 1 is placed below the pellicle and its tip is caused to approach obliquely that site of the pellicle 2 which is to be cut.

DETAILED DESCRIPTION OF PREFERRED EMBODIMENTS

Desirably, the organic solvent used in this invention has a low viscosity of not more than about 14 cP so that it can rapidly reach the surface of the membrane.

The organic solvent may be chosen depending upon the kind of the organic membrane to be cut. For example, if the organic membrane is composed of nitrocellulose, acetone, methyl isobutyl ketone (MIBK) and butyl acetate, for example, are conveniently used as the organic solvent. If it is formed of ethyl celluose, solvents having a boiling point of about 40° to 150° C., such as toluene, are suitable used to avoid volatilization that may occur before the solvent reaches the membrane surface at room temperature. Use of high-boiling organic solvents is likely to result in a situation in which the solvents remain in the organic membrane and exert deleterious effects.

Some examples of the method of cutting a pellicle in the process of producing devices provided with pellicles will be described with reference to the accompanying drawings.

Figure 1:
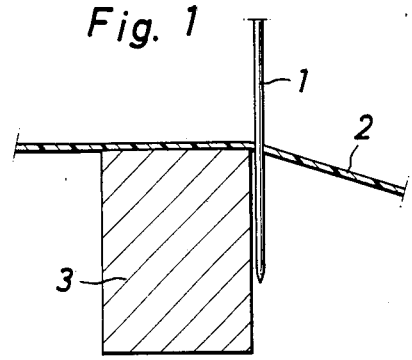

In the first example shown in FIG. 1, needle 1 is pierced through pellicle 2 from above, or put through the pellicle 2 while perforating it with an organic solvent trickled down from the needle tip. The needle is kept along the lateral end surface of pellicle frame 3 with a suitable clearance provided between them so as to permit occurrence of a capillary phenomenon. By the capillary phenomenon, the organic solvent injected from the tip of the needle or from a suitable site of the needle is caused to rise along the clearance and make contact with the membrane surface. While the membrane is thus dissolved with the solvent, the needle 1 is moved along the lateral end surface of the frame while the above clearance is maintained in a direction at right angles to the sheet surface in FIG. 1. As a result, the pellicle is cut along the frame.

In this embodiment, the needle 1 is kept along the lateral end surface of the pellicle frame with a suitable clearance between them. If desired, the needle 1 may be kept in intimate contact with the pellicle frame without providing such a clearance. In this alternative, part of the organic solvent injected from the needle 1 flows down along the lateral end surface of the frame. Furthermore, while the needle moves in contact with the lateral end surface of the frame, deflection may occur in the needle owing to friction with the lateral end surface of the frame or to the finishing of that surface. When the needle deflects, the organic solvent will scatter, and the rising of the solvent may temporarily be stopped. Despite this, since the needle moves while being guided by the lateral end surface of the frame, the cutting of the membrane along the frame can advantageously be effected easily and clearly.

Figure 2:
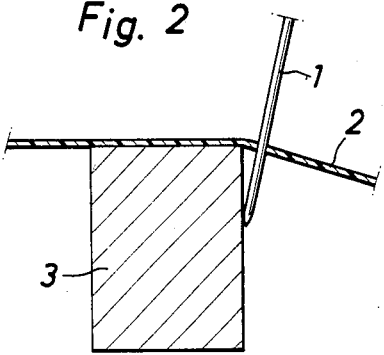

In the second embodiment shown in FIG. 2, needle 1 is obliquely put through pellicle 2 as in the embodiment shown in FIG. 1. While the needle tip is brought into contact with the lateral end surface of the frame or into approach to it with a suitable clearance, the needle is moved to cut the pellicle in the same way as in the first example.

In the second embodiment, when the needle tip is kept into contact with the lateral end surface of the frame, much the same effect as in the first embodiment is obtained. When it is kept apart from the lateral end surface of the frame, the effect obtained is reverse.

Figure 3:
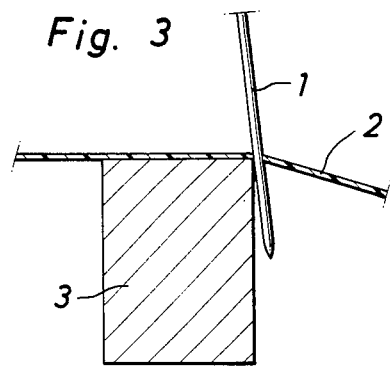

In the third embodiment shown in FIG. 3, needle 1 is put through pellicle 2 obliquely from the site of contact between pellicle frame 3 and the pellicle 2 in the same way as in the second embodiment. The pellicle 2 is cut by moving the needle in the same way as in the second embodiment while it is inclined with the frame 3 used as a fulcrum. In this embodiment, the organic solvent injected from the needle rises by the capillary phenomenon and does not fall down along the lateral end surface of the frame. Even if the needle happens to deflect during movement and the solvent scatters, the solvent scattered to the frame is liable to adhere to the small space between the needle tip and the lateral membrane. Since the needle moves while being guided by the frame, the membrane can be cut easily and clearly.

In any of the embodiments described above the needle moves while being pierced through the dissolved membrane. If the moving speed is too fast, mechanical cutting by the needle occurs before cutting by the solvent, and cut dust is generated. If it is too slow, a large amount of the solvent is supplied to the space between the needle and the frame to form a liquid reservoir although this depends upon the amount of the solvent supplied. This may possibly result in cutting undesired parts of the membrane, and no clear cut surface is obtained. Accordingly, the moving speed of the needle should be adjusted to a suitable value. For example, in the case of cutting a nitrocellulose membrane having a thickness of 0.8 to 3 microns, the moving speed of the needle is set usually at 11 to 100 mm/sec., preferably 45 to 10 mm/sec.

If the amount of the solvent supplied to the needle is too large, there is a possibility that unwanted parts of the membrane will also be dissolved. If it is small, the membrane cannot be cut by dissolving. The suitable amount of the solvent to be supplied to the needle is usually about $1 \times 10^{-4}$ ml/min. to about $1 \times 10^{-1}$ ml/min., preferably about $5 \times 10^{-4}$ ml/min. to about $5 \times 10^{-2}$ ml/min.

Figure 4:
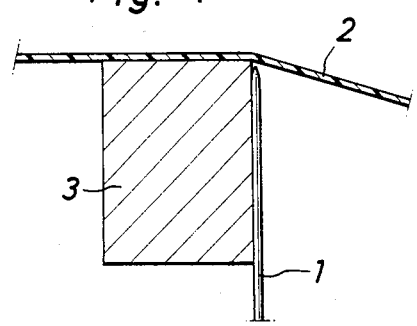
Figure 5:
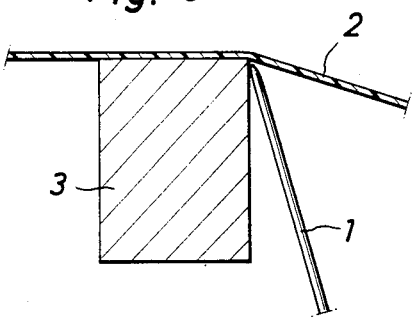

In the fourth and fifth embodiments shown in FIGS. 4 and 5, unlike the embodiments described above, the needle 1 is placed below the pellicle and brought into contact with, or approach to, the lateral end surface of the pellicle frame (FIG. 4) or inclined (FIG. 5). In this state, the needle tip is caused to approach that site of the membrane which is to be cut, and the solvent injected from the needle tip is directly contacted with the membrane to cut it by dissolving.

In the fourth and fifth embodiments, there is no likelihood of mechanical cutting by the needle irrespective of its moving speed. As in the foregoing embodiments shown in FIGS. 1 to 3, the effects of the fourth and fifth embodiments differ between the case in which the needle or its tip is kept in contact with the lateral end surface of the frame and the case in which it is caused to approach the lateral end surface of the frame with a suitable clearance.

What is claimed is:

1. In the process of producing a device in which an organic membrane is adhered to, or intimately adhered to, a frame or a substrate, a method of cutting the organic membrane which comprises bringing an injection syringe-like needle into contact with, or approach to, the lateral end surface of the frame and while moving it along said lateral end surface, injecting an organic solvent capable of dissolving the organic membrane from the needle, whereby the membrane is cut along the frame by dissolving.

2. The method of claim 1 wherein the organic membrane is a pellicle.

3. The method of claim 2 wherein the pellicle is a nitrocellulose membrane or an ethyl cellulose membrane.

* * * * *